(12) United States Patent
Lipowski et al.

(10) Patent No.: US 7,962,174 B2
(45) Date of Patent: Jun. 14, 2011

(54) TRANSCEIVER ARCHITECTURE AND METHOD FOR WIRELESS BASE-STATIONS

(75) Inventors: Joseph T. Lipowski, Chester, NJ (US); Rajiv Chandrasekaran, Morristown, NJ (US)

(73) Assignee: Andrew LLC, Hickory, NC (US)

( * ) Notice: Subject to any disclaimer, the term of this patent is extended or adjusted under 35 U.S.C. 154(b) by 904 days.

(21) Appl. No.: 11/456,948

(22) Filed: Jul. 12, 2006

(65) Prior Publication Data

US 2008/0014866 A1    Jan. 17, 2008

(51) Int. Cl.
- H04M 1/00 (2006.01)
- H04B 1/46 (2006.01)
- H04B 1/04 (2006.01)

(52) U.S. Cl. .......... 455/561; 455/82; 455/114.3
(58) Field of Classification Search .......... 348/678; 375/296

See application file for complete search history.

(56) References Cited

U.S. PATENT DOCUMENTS

| | | | |
|---|---|---|---|
| 4,823,136 A * | 4/1989 | Nathanson et al. | 342/368 |
| 5,247,310 A | 9/1993 | Waters | |
| 5,457,811 A * | 10/1995 | Lemson | 455/67.11 |
| 5,548,813 A | 8/1996 | Charas et al. | |
| 5,603,089 A | 2/1997 | Searle | |
| 5,689,272 A | 11/1997 | Harrison et al. | |
| 5,724,666 A | 3/1998 | Dent | |
| 5,754,139 A | 5/1998 | Turcotte et al. | |
| 5,754,957 A | 5/1998 | Khan | |
| 5,758,269 A * | 5/1998 | Wu | 455/127.3 |
| 5,771,017 A | 6/1998 | Dean et al. | |
| 5,793,253 A * | 8/1998 | Kumar et al. | 330/124 R |
| 5,825,762 A | 10/1998 | Kamin et al. | |
| 5,854,611 A | 12/1998 | Gans | |
| 5,856,804 A | 1/1999 | Turcotte et al. | |
| 5,875,212 A * | 2/1999 | Fleek et al. | 375/329 |
| 5,896,568 A | 4/1999 | Tseng et al. | |
| 5,903,826 A | 5/1999 | Nowak | |
| 5,924,020 A | 7/1999 | Forssen | |
| 5,936,577 A | 8/1999 | Shoki | |
| 5,936,578 A | 8/1999 | Driessen et al. | |
| 5,966,094 A | 10/1999 | Ward et al. | |
| 5,973,641 A | 10/1999 | Smith et al. | |
| 6,016,123 A | 1/2000 | Barton et al. | |
| 6,038,459 A | 3/2000 | Searle et al. | |
| 6,043,790 A | 3/2000 | Derneryd et al. | |
| 6,047,199 A | 4/2000 | DeMarco | |
| 6,067,053 A | 5/2000 | Runyon et al. | |
| 6,072,432 A | 6/2000 | Powell et al. | |
| 6,094,165 A | 7/2000 | Smith | |

(Continued)

FOREIGN PATENT DOCUMENTS

EP    0994567 A2    4/2000

(Continued)

Primary Examiner — Yuwen Pan
Assistant Examiner — Ayodeji Ayotunde
(74) Attorney, Agent, or Firm — Wood, Herron & Evans, LLP

(57) ABSTRACT

A system for wireless communications includes a tower structure supporting at least one transmit antenna at an elevated position on the tower structure and base electronics positioned proximate a base of the tower structure. The base electronics are coupled with the transmit antenna and include an initial stage amplifier for amplifying an input signal to provide a low power transmission signal that is provided to the transmit antenna at the elevated position. A final stage amplifier is positioned proximate the transmit antenna. The final stage amplifier is a high efficiency amplifier for efficiently amplifying the low power transmission signal from the base electronics to provide a high power transmission signal to be transmitted from the transmit antenna.

31 Claims, 2 Drawing Sheets

U.S. PATENT DOCUMENTS

| | | | | |
|---|---|---|---|---|
| 6,108,527 A * | 8/2000 | Urban et al. | ............... | 455/115.3 |
| 6,118,335 A * | 9/2000 | Nielsen et al. | ................ | 330/2 |
| 6,133,868 A | 10/2000 | Butler et al. | | |
| 6,151,310 A * | 11/2000 | Dent | ............... | 370/330 |
| 6,157,343 A | 12/2000 | Andersson et al. | | |
| 6,198,434 B1 | 3/2001 | Martek et al. | | |
| 6,233,466 B1 | 5/2001 | Wong et al. | | |
| 6,243,038 B1 | 6/2001 | Butler et al. | | |
| 6,275,685 B1 * | 8/2001 | Wessel et al. | ................ | 455/126 |
| 6,411,825 B1 * | 6/2002 | Csapo et al. | ................ | 455/561 |
| 6,496,061 B1 * | 12/2002 | Bloom et al. | ................ | 330/51 |
| 6,583,763 B2 | 6/2003 | Judd | | |
| 6,597,325 B2 | 7/2003 | Judd et al. | | |
| 6,608,527 B2 * | 8/2003 | Moloudi et al. | ............. | 330/301 |
| 6,609,013 B1 | 8/2003 | Oh | | |
| 6,621,469 B2 | 9/2003 | Judd | | |
| 6,640,111 B1 * | 10/2003 | Shapira | ................ | 455/562.1 |
| 6,681,101 B1 * | 1/2004 | Eidson et al. | ............. | 455/127.1 |
| 6,690,328 B2 | 2/2004 | Judd | | |
| 6,701,134 B1 * | 3/2004 | Epperson | ................ | 455/102 |
| 6,791,417 B2 * | 9/2004 | Pengelly et al. | ............... | 330/295 |
| 6,906,681 B2 | 6/2005 | Hoppenstein | | |
| 7,053,838 B2 | 5/2006 | Judd | | |
| 7,133,655 B2 * | 11/2006 | Chiu | ................ | 455/226.4 |
| 7,433,656 B2 * | 10/2008 | Kappes et al. | ............. | 455/114.2 |
| 7,453,952 B2 * | 11/2008 | Saed et al. | ................ | 375/296 |
| 2002/0151332 A1 * | 10/2002 | Eddy | ............... | 455/561 |
| 2004/0204109 A1 * | 10/2004 | Hoppenstein | ............. | 455/562.1 |
| 2004/0219950 A1 | 11/2004 | Pallonen | | |
| 2005/0208910 A1 * | 9/2005 | Burns et al. | ................ | 455/127.3 |
| 2005/0232370 A1 | 10/2005 | Trachewsky | | |
| 2005/0242880 A1 * | 11/2005 | Domokos et al. | ............. | 330/280 |
| 2007/0298736 A1 * | 12/2007 | Fujioka et al. | ............. | 455/127.3 |

FOREIGN PATENT DOCUMENTS

| | | |
|---|---|---|
| EP | 1049195 A2 | 5/2003 |
| JP | 8102618 | 4/1996 |
| WO | WO9811626 | 3/1998 |
| WO | WO9839851 A1 | 9/1998 |
| WO | WO2004098104 A1 | 11/2004 |

* cited by examiner

TRANSCEIVER ARCHITECTURE AND METHOD FOR WIRELESS BASE-STATIONS

FIELD OF THE INVENTION

The present invention is directed to wireless transceiver systems for use in wireless communication systems, and specifically is directed to a transceiver architecture for a wireless base-station that has applicability in wireless networks, such as cellular networks, and WiMAX networks.

BACKGROUND OF THE INVENTION

Wireless communication networks are utilized for a variety of different applications, including the transfer of voice and data information between the users of such networks. For example, advanced wireless networks are utilized for wireless communication applications, such as cellular systems, including cellular telephone systems, and other wireless networks, such as the more recent WiMAX networks.

In general, a wireless communication network utilizes a fixed network that may include or be functionally coupled with existing communications networks, such as the established Public Switched Telephone Network (PSTN) or other networks having a fixed functionality for backbone transmission. The fixed network is coupled through a switching network to a plurality of individual and remote base-stations. For example, a base-station may define a cell in a cellular system. The customers' devices, such as mobile phones, and other devices, interface with the base-stations for communication purposes. Generally, existing base stations are low-power, multiple-channel two-way radios that are in a fixed location. For example, when a call is made on a mobile phone device, the call is routed to a nearby base-station. From that base-station, the phone call is connected into a network, such as a regular land-line phone system or into a mobile phone network, via the switching network. To date, base-stations in a mobile phone network or cellular network are often referred to as a cellular phone tower, generally referring to the tower or support on which the antennas of the base-station are mounted. Each base-station generally comprises a number of transmitters and receivers, or transceivers.

FIG. 1 illustrates a block diagram of a basic base-station architecture. Generally, the base-station 10 includes a base 20 and a tower or support structure 22. The base may comprise the various channel electronics and transceiver electronics for the base-station which are located in a housing or shed positioned proximate the base of the tower or support structure 22. In FIG. 1, the tower or support structure is indicated as a tower top, as oftentimes the antennas for a base-station are positioned at or near the top of the tower or support structure. However, while it is generally desirable to position the antennas at the highest possible point for better reception, they might be positioned anywhere on the tower or support structure. Coupling the base electronics 20 with the tower top or tower 22 are coaxial cables 24.

Signals to and from a fixed network, that are interfaced to the base-station through a switching network, are indicated by reference numeral 26. On the transmitter side of the base station, often referred to as the down link, voice signals and/or data signals are encoded by appropriate channel cards. The channel cards include appropriate encoder circuitry 30 that encodes the signals according to the chosen wireless standard, such as GSM, CDMA, WCDMA, etc. The encoded signals are then digitally modulated by appropriate modulator/demodulator electronics 32 and then are digitally upconverted to a composite analog signal by appropriate conversion circuitry 34 (DUC). The composite analog signal is then directed to the appropriate transceiver circuitry 36 of the base-station electronics 20. In transmission, the composite analog signal is generally amplified by an appropriate high power amplifier or amplifiers to a sufficiently higher power level for transmission through the antennas on the tower 22. Because of the distortion introduced into the signal by such high power amplifiers, a linearization scheme will generally be utilized. For example, digital predistortion (DPD) might be used to linearize the signals coming from the high power amplifiers. Generally, such digital predistortion anticipates the distortion that is introduced by the high power amplifiers and predistorts the input signal to the amplifiers so that the amplified signal is more linear and the overall distortion is reduced. Generally, the digital predistortion is performed after the signals have been digitally modulated and upconverted, but before they are amplified. The signals are then directed on one or more transmit coaxial cables 38 to the tower or tower top 22 where they are transmitted via one or more antennas 40. Also at the tower top, appropriate filter/duplexer circuitry 42 might be utilized, such as to separate the transmit and receive signals. The transmitted signals are then received by appropriate customer equipment, such as mobile telephones.

On the receiver side or the uplink, signals are received from the mobile devices and are captured by one or more receive antennas 46. The uplink signals are received, filtered, and directed to the appropriate receiver circuitry through filter/duplexer circuitry 42. Signals are routed by the appropriate coaxial cables 24 to transceiver circuitry 36. Generally, the transceiver circuitry 36 includes one or more low-noise amplifiers (LNA) that are used to amplify the received signals. The signals are then mixed down to an intermediate frequency (IF), digitized, and demodulated using the digital demodulator circuitry 32. The demodulated channels from channel cards 28 are then routed to appropriate circuitry via a switching network and lines 26. While the transceiver block assumes a single block and combines elements of a transmitter and a receiver, the circuitry might also be separate circuits for such transmit and receive functionality.

Conventionally, all the active electronic components of the base-station, except for the transmit and receive antennas 40, 46 and some filtering/duplexing circuitry 42 are located at the base of the tower 20, such as in a housing or shed. Coaxial cables 24 couple the base-station electronics 20 with the top of the tower or other support 22 and the appropriate antennas 40, 46 as noted. For the transmission function, the coaxial cables must be capable of carrying high power RF signals to the tower top 22 for transmission using directional and/or sectorized antennas 40. However, as is well known in the art, a large amount of the transmit power is lost in the coaxial cables 24 because of cable impedance and transmission loss.

It has been proposed to position amplifiers at the tower top 22 and very near the transmit antenna elements 40 to reduce the transmission loss and thereby increase the power efficiency and reliability of a base-station. However, amplifiers positioned at the top of a tower along with the antennas to form what is often referred to as an "active antenna" arrangement are not as wide-spread as desired due to various technical considerations that must be addressed. First, the tower-top electronics must be highly reliable to avoid frequent trips by maintenance personnel. Furthermore, linearization is often required to linearize the output of the power amplifiers due to the requirements of various modulation and transmission schemes. For example, digital predistortion might be utilized with a high power transmit amplifier. As such, linearization electronics, such as digital predistortion might have to be implemented along with the amplifier at the tower top. This requires additional electronics at the top of the tower along with the high power amplifiers, and all such electronics would have to be properly cooled, such as convectionally cooled. Currently, the amplifiers and existing base-stations do not meet these requirements, and, hence, the amplifiers still remain at the base of the tower and the resulting loss of efficiency in the coaxial cables is tolerated.

With the receiver circuitry, the coaxial cables are used to carry the signals from the receive antennas 46 at the top of the tower to the base 20, where low noise amplifiers (LNAs) and the digital demodulators are located. In some architectures, the LNAs might be placed at the top of the tower next to the receive antennas 46 in order to improve the sensitivity of the receiver. Unlike power amplifiers on the transmitter side, the LNAs produce significantly lower power signals. Nevertheless, the LNAs are also required to be highly reliable if they are placed at the tower top 22.

Therefore, there is a need to address the power losses associated with base-stations utilizing conventional base-located electronics, tower-top antennas and coaxial cables. There is further need to address such power efficiencies, while still maintaining the linearity of the signal transmission.

Another aspect to be addressed involves the frequency allocation standards that are utilized for the wireless communication system. In some wireless standards, separate frequencies are assigned for the transmitter and the receiver, thus enabling them both to function simultaneously. Such a standard is termed a Frequency Division Duplex (FDD) system. Currently popular standards, such as CDMA, GSM, IS, IS-136, and WiMAX, are examples of such FDD systems.

Alternatively, the transmitter and receiver signals might be positioned in the same frequency band, and they are multiplexed in the time domain so that only one of them is operational. That is, at any given time, the base-station is either receiving or transmitting signals. These systems are termed Time Division Duplex (TDD) systems. As such, improvements to base-station efficiency must also address these various wireless standards that are utilized for any particular application.

The present invention addresses the needs in the art and provides an overall improvement in the efficiency of a base-station, while maintaining the desired linearity of the high power transmission signals.

DETAILED DESCRIPTION OF EMBODIMENTS OF THE INVENTION

Figure 1:
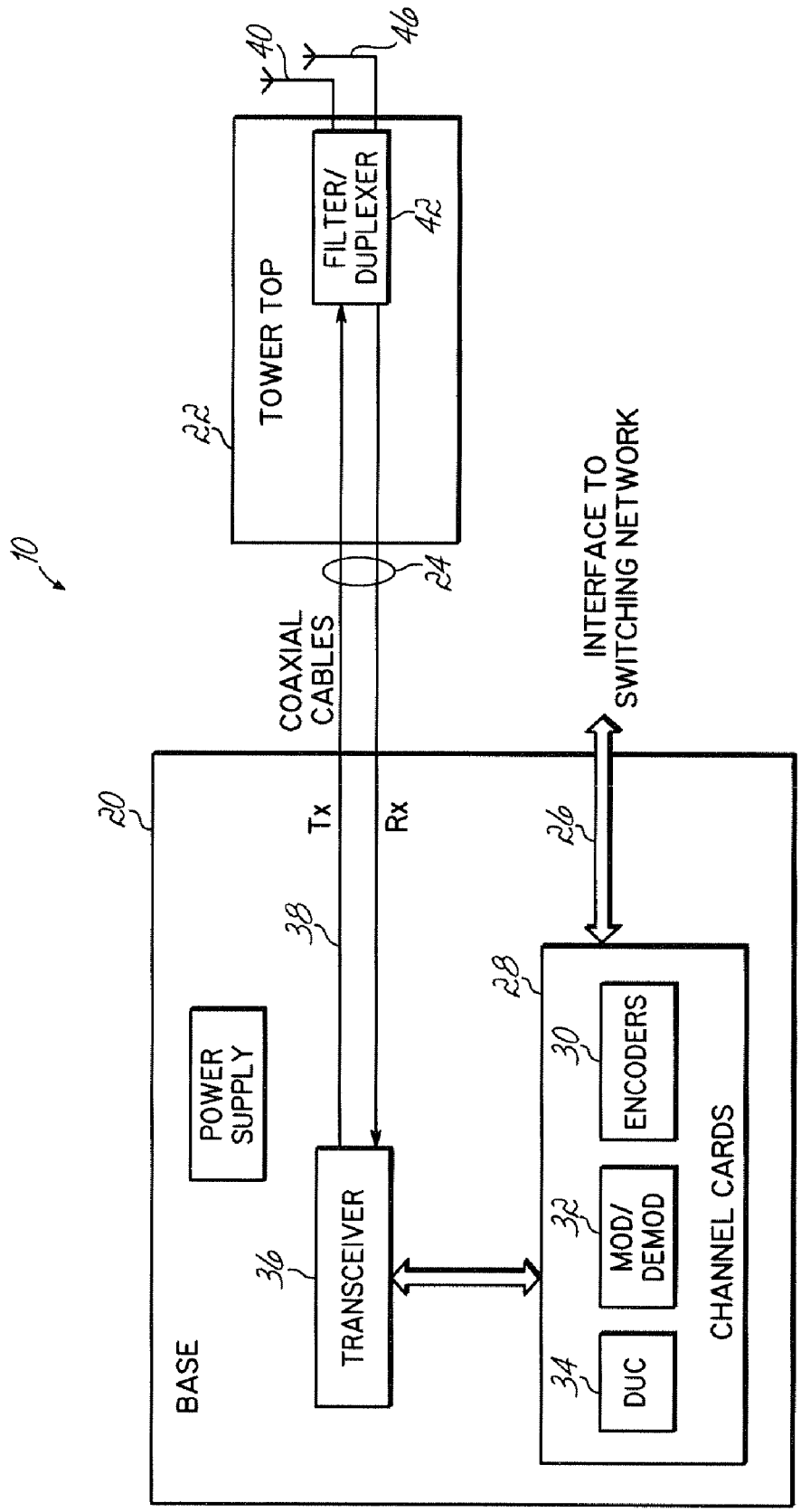
FIG. 1 is a block diagram illustrating a conventional base-station and antenna support/tower arrangement for a wireless communication system.
Figure 2:
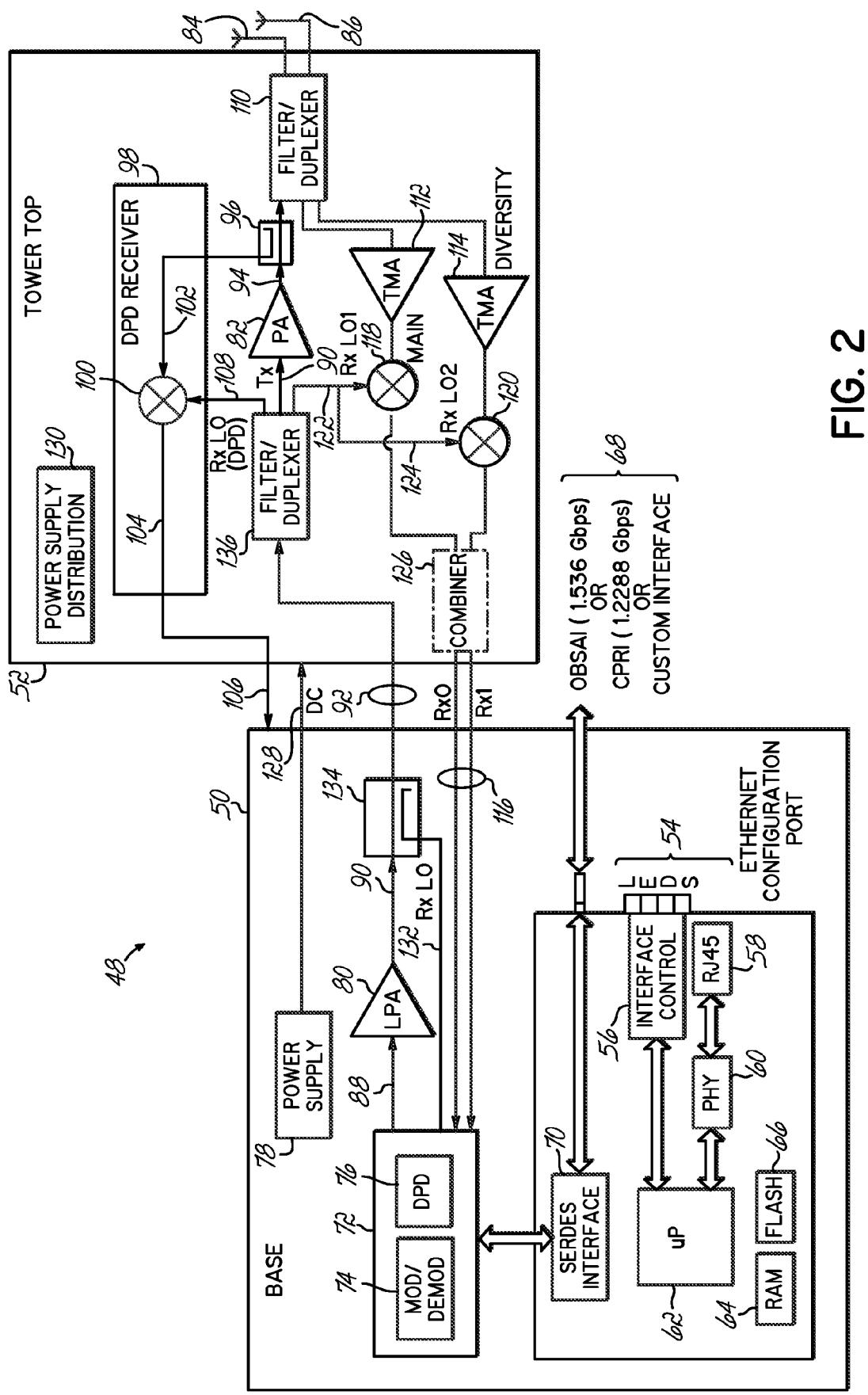
FIG. 2 is a block diagram illustrating a base-station in accordance with one embodiment of the present invention.

FIG. 2 illustrates one embodiment of a system 48 for wireless communications in accordance with the principles of the present invention. As utilized in FIG. 1, the various components illustrated in the block diagram might be utilized in an environment commonly considered a base-station, although the present invention has applicability other than with a conventional base-station. Referring to FIG. 2, the various components of the system are indicated as located in or at a base 50 or at a tower top 52. As noted, base 50 generally refers to the base of a tower structure or other support structure on which transmit and receive antennas are mounted. Base 50 generally indicates a position of the various components rather than a particular form for the base. In one example, the base might be a traditional housing or shed which is utilized to contain, cover and cool the components, to keep them in an environment with a generally consistent temperature and generally unexposed to the elements. Of course, the physical structure of the base housing is not limiting with respect to the present invention. Similarly, the tower top 52 generally refers to a location which is spaced from and usually vertically above the base 50. While it is desirable to position transmit and receive antenna elements, as well as various components of the invention at or proximate to the top of a tower for coverage, tower top 52 may also generally refer to a position on the tower structure or other support structure that is not exactly at the top or near the top. As such, the terminology generally used in FIG. 2 to designate the tower top 52 is illustrative only and is not limiting with respect to the invention, and the invention does not require that the antenna elements and those components proximate to the antenna elements be located at the top of the tower or other support structure. For example, the invention might be used in a base-station in a building and the antennas and other components described might be positioned on the building, while the base components are in the building. Furthermore, the base 50 and tower top 52 might simply be two separated locations when the system is implemented in a scenario that does not use a tower or other elevated structure.

Referring to FIG. 2, base 50 incorporates suitable electronics for interfacing with voice and data networks. For example, base 50 might be coupled with a suitable Ethernet system through an Ethernet configuration port 54 which utilizes an appropriate interface control 56, as well as connectors 58 and an Ethernet physical layer (PHY) 60, that are controlled by an appropriate microprocessor 62. Microprocessor 62 might also be supported by RAM 64 and flash memory 66, as is known in the art. The base components may also include an appropriate voice interface 68 which may utilize a custom interface, a common public radio interface (CPRI), or an open base-station architecture initiative interface (OBSAI). The voice interface 68 couples to an appropriate serializer/deserializer (SERDES) interface 70.

The transceiver circuitry 72 of the base 50 also includes appropriate modulator/demodulator components 74. Transceiver circuitry 72 may also include appropriate circuitry for digitally encoding the voice and/or data that are received from and transmitted to a remote location, such as a switching network (not shown) coupled to base 50 through the voice interface 68 or data interface 54. A predistortion circuit 76 is utilized to predistort the input signal to address distortion in the high power amplifier stage of the system. For example, the distortion circuit 76 might be a digital predistortion circuit (DPD) that includes look-up tables, for example, to provide predistortion to an input signal that is to be amplified and ultimately transmitted. Base 50 also includes a suitable power supply 78 for powering the various components therein.

The voice and/or data to be transceived through the system 48 is digitally encoded and modulated by modulator/demodulator circuitry 74 and is processed by the predistortion circuit 76. Next it is appropriately converted to a low level analog signal from a digital signal and is upconverted to an RF carrier frequency, as is generally known in the art. Such signal processing in the transceiver circuitry 72 of a base-station would be known to a person of ordinary skill in the art.

In accordance with one particular aspect of the invention, the system 48 utilizes an initial stage amplifier which is a low power amplifier 80 (LPA). The initial stage amplifier 80 generally refers to its positioning within the system and may actually incorporate multiple amplifier stages therein that provide the initial low-power amplification. The LPA 80 is located at the location referred to as base 50.

In accordance with another aspect of the invention, a final stage of amplification is provided by a power amplifier 82 that is located at a location spaced from or remote from the base location. In one exemplary implementation, the location might be the top of a tower or other support structure, as illustrated in FIG. 2. The low-level analog signal which has been appropriately upconverted to RF may typically be around 0 dBm, and thus must be amplified to a sufficiently high output power for transmission through one or more transmit antennas 84 shown with receive antennas 86 at the location indicated as the tower top 52. While single antenna elements are illustrated, arrays of such transmit and receive antenna elements might be utilized. Also, for the receive side, there might be a main receive antenna and a diversity antenna associated therewith. As previously noted, the antenna elements 84, 86 are supported on the tower structure at an elevated position thereon, such as the tower top. The base electronics of base 50, on the other hand, are spaced from the antennas, such as proximate a base of the tower structure, which generally refers to the ground area proximate the base of the tower structure. The initial stage low power amplifier 80 amplifies the modulated and predistorted input signal 88 to provide a low-power transmission signal 90 that is then provided to the transmit antenna 84 for transmission. One or more coaxial cables 92 may couple base location 50 with the tower top location 52. Generally, the initial stage amplifier 80 provides a greater percentage of the amplification of the input signal 88 than the final stage amplifier 82. In one embodiment, the initial stage amplifier may provide amplification in the range of 25-40 dB of gain. Typical low-power signals might be amplified to a level in the range of 30-35 dBm, for example. Low-power transmission signal 90 from the output of amplifier 80 is carried by coaxial cables 92 to the tower top where it is amplified by final stage power amplifier 82. The final stage power amplifier might provide gain in the range of 10-15 dB and generally 12-14 dB of gain might be utilized, for example. The low power signal 90 reduces the amount of power lost due to the transmission loss in the cables 92.

In accordance with another aspect of the invention, the final stage power amplifier 82 is a high efficiency amplifier for efficiently amplifying the low-power transmission signal to provide a high power transmission signal, that is then transmitted from the transmit antennas 84. As illustrated in FIG. 2, the final stage power amplifier 82 is located proximate the transmit antennas 84 at the elevated position 52. Final stage power amplifier 82 is typically an ultra-efficient power amplifier with efficiencies greater than 30%. For example, ultra-efficient amplifier technology available from Andrew Corporation, which is the owner of the present application, would be useful in practicing the invention.

In accordance with another aspect of the invention, since the final stage of amplification is provided at the tower top location by an ultra-efficient amplifier, very low power dissipation results at the tower top. This provides a significant advantage in the reliability of the overall system. For example, a 20 Watt output amplifier that is approximately 30% efficient would dissipate only 46 Watts. Accordingly, at such power dissipation levels, convection cooling can be achieved at the tower top with very high reliabilities. As previously noted, one particular problem that has plagued active antenna designs utilizing amplification at the tower top is that they are difficult to repair and, thus, must be very reliable. The present invention addresses such shortcomings in the prior art by providing an amplifier stage that is highly reliable and may be convectionally cooled. This reduces the need for frequent repairs at the tower top.

In one example, the final stage amplifier might be a high efficiency Doherty amplifier arrangement as set forth in U.S. Pat. No. 6,922,102 and U.S. patent application Ser. No. 10/795,055, entitled HIGH EFFICIENCY AMPLIFIER, filed Mar. 5, 2004, now U.S. Pat. No. 7,064,606; U.S. patent application Ser. No. 10/973,360 entitled HIGH EFFICIENCY AMPLIFIER, filed Oct. 26, 2004, now U.S. Pat. No. 7,148,746; and U.S. patent application Ser. No. 11/291,172, entitled HIGH GAIN, HIGH EFFICIENCY AMPLIFIER, filed Dec. 1, 2005, now U.S. Pat. No. 7,362,170; which patents and applications are all incorporated herein by reference in their entireties. While amplifier 82 is shown as a single element, it could include multiple stages.

In accordance with another aspect of the invention, the predistortion circuit 76 utilizes a predistortion function, such as look-up tables, that are dynamically updated. For dynamic updating and adaptation, the predistortion function requires a feedback sample of the high power transmission signal 94 that is output from the final stage amplifier 82 and directed to the transmit antennas 84. However, the sample of the high power transmission signal 94 is required at base 50 where the predistortion circuitry 76 is located. In the invention, a coupler circuit 96 located at the tower top location couples a sample of the high power transmission signal from amplifier 82 and directs it to a predistortion receiver 98. The predistortion receiver 98 incorporates appropriate signal mixing circuitry 100 that is used to downconvert the amplifier output sample 102 to a suitable IF signal 104, that is then digitized and provided back to the base utilizing an appropriate cable 106, such as a coaxial cable, that couples with the predistortion circuit 76. Therefore, while the base electronics include a predistortion circuit for predistorting the input signal to the initial stage amplifier 80, the predistortion receiver of the invention is positioned at the tower top proximate the final stage amplifier 82 and is coupled to receive a sample of the high power transmission signal from amplifier 82 to provide it back to the predistortion circuit 76 at the base location 50. For such downconversion in the predistortion receiver 98, an appropriate LO signal 108 is necessary and is provided to the tower top in accordance with another aspect of the present invention as discussed below.

The system 48 also incorporates a receive functionality associated with the receive antennas 86. The high power transmission signal 94 is directed to the transmit antenna elements 84 through an appropriate filter/duplexer 110 which separates the transmit and receive frequencies, as is known in the art. The receive signals captured by receive antennas 86 are also directed through the filter/duplexer 110 to appropriate amplifiers 112, 114. The tower-mounted receive amplifiers (TMA) 112, 114 are generally low-noise amplifiers (LNA). The LNAs are placed at the top of the tower next to the receive antennas in order to improve the sensitivity of the receiver. Generally, it is common to use multiple receive antennas, such as multiple receive antennas in a single cellular or wireless sector served by the system 48. One receive antenna might be considered the main antenna (amplifier 112), whereas the other antenna might be considered a diversity antenna (amplifier 114) in order to insure proper reception of the uplink signals from a remote device, such as a cellular telephone. In accordance with another aspect of the invention, the RF receive signals from the receive amplifiers 112, 114 are mixed down to a suitable intermediate frequency (IF) and are sent down to the base via separate cables 116, such as coaxial cables. To that end, the tower top electronics incorporate suitable mixer circuitry 118, 120 for downconverting the received signals to an appropriate IF. The IF signals are then directed back to the base electronics 50 where they are digitized, demodulated, and then routed to appropriate switching networks. For such downconversion at the tower top location, appropriate LO signals 122,124 are necessary. In FIG. 2, the appropriate LOs are indicated as Rx LOs that are utilized to downconvert the received signals to appropriate IF signals for transmission back to the base electronics 50.

In one embodiment, each of the receive signal components may be downconverted to a different IF. The signals might be then combined, such as utilizing an appropriate combiner or summer 126. The resulting summed signals can then be transmitted to the base, such as over a single coaxial cable 116, where they can be separated utilizing appropriate filters (not shown). To that end, the Rx LO 1 would be a different frequency than the frequency of Rx LO 2.

In another embodiment, as illustrated in FIG. 2, the identical Rx LO might be utilized for both the main system 118 and the diversity system 120 such that the received signals are all mixed down to the same IF frequency and then are sent down to the base utilizing separate cables 116. The separate cables and corresponding signals are indicated in FIG. 2 as Rx 0 and Rx 1, which are directed back to the appropriate transceiver circuitry 72 in the base location 50.

In accordance with another aspect of the present invention, system 48 is useful with a TDD system. In such a system, the transmit and receive signals are centered at the same frequency. To address that situation, the present invention utilizes an Rx LO that is chosen such that the IF frequency output from the appropriate receivers 118, 120 are sufficiently separated from the transmit frequency Tx in order to minimize interference from the transmitter on the receiver portion of the system.

In one embodiment of the invention, DC power from power supply 78 might be directed to the tower top via an appropriate cable 128. The power might be directed to a power supply distribution network 130, which then distributes it as appropriate for the amplifier stage 82, as well as the tower-mounted amplifiers 112, 114 and other appropriate electrical components at the tower top location 52. Alternatively, the DC power may be optionally transmitted along with various of the other RF signals over the same cable or cables, such as those indicated by reference numeral 92 and used to provide the RF transmission signals to the tower top.

As noted above, the low power transmission signals 90 are RF signals that are directed to the tower top for further amplification and ultimately transmission. To that end, cable(s) 92 couple base location 50 with tower top location 52. The receivers 118, 120, as well as the predistortion receiver 98 require appropriate LO frequency signals for operation. In one aspect of the invention, in order to minimize the signals transmitted to the top of the tower, the LO for the predistortion receiver 108 and the LO signals for the receivers 122, 124 are summed and transmitted together. To that end, circuitry 72 includes a frequency source for generating a plurality of LO frequencies 132. The LO frequencies are summed together and coupled with appropriate coupling circuitry 134 onto the lines or cables 92 carrying the low power transmission signals 90. In that way, all the signals are transmitted to the tower top 52 together. At the tower top, appropriate filter/duplexer circuitry 136 is utilized to separate the signals into the low power transmission signal 90, as well as the various LOs 108, 122, 124 that are indicated as Rx LOs. The Rx LOs are then used to mix the received signals and the sample of the amplifier output for the predistortion receiver 98 down to suitable IF signals.

Accordingly, the present invention enables the use of high power amplifiers at the top of the tower that may be appropriately cooled and are reliable, thus overcoming various shortcomings of prior art systems. Furthermore, tower-mounted LNAs may be utilized along with one or more power amplifiers at the top of the tower and are provided with suitable LO signals for the receiver systems to downconvert the received signals to IF at the tower top, for further processing at the base. The present invention is applicable to both TDD and FDD systems. Furthermore, the design is flexible and is applicable to most wireless standards including GSM, CDMA2000, UMTS, WCDMA, North American TDMA, and TDS-CDMA. Furthermore, the architecture is also applicable to the emerging WiMAX networks.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed:

1. A system for wireless communications comprising:
   a tower structure supporting at least one transmit antenna at an elevated position on the tower structure;
   base electronics positioned proximate a base of the tower structure and coupled with the transmit antenna, the base electronics including an initial stage amplifier for initially amplifying an input signal proximate the base of the tower to provide a low power transmission signal that is then provided to the transmit antenna at the elevated position;
   a final stage amplifier positioned away from the base electronics and at the elevated position with the transmit antenna, the final stage amplifier being a high efficiency amplifier for efficiently amplifying the low power transmission signal from the base electronics to provide a high power transmission signal to be transmitted from the transmit antenna;
   the base electronics further including a predistortion circuit positioned proximate the base of the tower for predistorting the input signal to the initial stage amplifier;
   a predistortion receiver positioned proximate the final stage amplifier at the elevated position and coupled with the predistortion circuit, the predistortion receiver configured to receive a representative sample of the high power transmission signal for use by the predistortion circuit.

2. The system of claim 1 wherein the initial stage amplifier provides a greater percentage of the amplification of the input signal than the final stage amplifier.

3. The system of claim 2 wherein the initial stage amplifier provides in the range of 25-40 dB of gain.

4. The system of claim 2 wherein the final stage amplifier provides in the range of 10-15 dB of gain.

5. The system of claim 1 wherein the final stage amplifier has an efficiency greater than 30%.

6. The system of claim 1 wherein the final stage amplifier is a high efficiency Doherty amplifier arrangement.

7. The system of claim 1 wherein the base electronics further include a frequency source for generating at least one LO frequency, the LO frequency combined with the low power transmission signal and directed to the predistortion receiver at the elevated position.

8. A system for wireless communications comprising:
at least one transmit antenna positioned at a first remote location;
transceiver circuitry positioned at a second base location spaced from the remote location and operable for providing a low power transmission signal that is provided to the remote location;
an amplifier positioned proximate the transmit antenna at the remote location for amplifying the low power transmission signal to provide a high power transmission signal at the remote location to be transmitted from the transmit antenna;
a predistortion circuit at the base location, the predistortion circuitry configured for predistorting the transmission signal provided to the remote location;
a predistortion receiver positioned proximate the amplifier at the remote location and coupled with the predistortion circuit at the base location, the predistortion receiver configured to receive a sample of the high power transmission signal at the remote location and process the high power transmission signal for provision of a representative sample of the high power transmission signal to the predistortion circuit at the base location.

9. The system of claim 8 wherein the remote location is an elevated position on a support structure and the base location is at a base of the support structure.

10. The system of claim 8 further including a frequency source at the base location for generating at least one LO frequency, the LO frequency combined with the low power transmission signal and directed to the predistortion receiver at the remote location.

11. The system of claim 10 wherein the predistortion receiver processes the transmission signal by combining the sample of the high power transmission signal and the LO frequency to form an IF signal that is used by the predistortion circuit.

12. The system of claim 8 further including:
at least one receive antenna at the remote location to capture a receive signal;
a frequency source at the base location for generating at least one LO frequency, the LO frequency combined with the low power transmission signal and directed to the remote location;
a filter at the remote location to separate the LO frequency and the low power transmission signal.

13. The system of claim 12 including a plurality of receive antennas at the remote location and wherein the frequency source at the base location is operable for generating a plurality of LO frequencies for combining with a plurality of receive signals at the remote location to form a plurality of IF signals.

14. The system of claim 13 wherein the plurality of IF signals have different IF frequencies and further including a combiner circuit at the remote location to combine the different IF frequencies for transmission to the base location.

15. The system of claim 13 wherein the plurality of IF signals have the same IF frequency and further including plurality of receive cables for transmission of the IF signals to the base location.

16. The system of claim 11 wherein the IF signal has a frequency sufficiently separated from the frequency of the high power transmission signal in order to reduce interference.

17. The system of claim 8 further comprising a signal source at the base location for generating a signal for use by the predistortion receiver, the signal being combined with the low power transmission signal and directed to the remote location.

18. The system of claim 17, the predistortion receiver configured for using the signal to frequency convert the sample of the high power transmission signal to form a frequency converted signal that is used by the predistortion circuit for the purposes of predistorting the transmission signal.

19. The system of claim 18 wherein the signal is separated from the low power transmission signal at the remote location and used to provide an LO signal to frequency conversion circuitry to form the frequency converted signal.

20. A method for providing wireless communications comprising:
positioning at least one transmit antenna at a first remote location;
forwarding a low power transmission signal from a base location to the transmit antenna at the remote location;
amplifying, at the remote location, the low power transmission signal with an amplifier, the amplifier being a high efficiency amplifier for efficiently amplifying the low power transmission signal to provide a high power transmission signal to be transmitted from the transmit antenna;
predistorting the transmission signal with a predistortion circuit at the base location before it is forwarded to the remote location;
at the remote location, coupling off a sample of the high power transmission signal and processing the high power transmission signal and providing a representative sample of the high power transmission signal back to the predistortion circuit at the base location.

21. The method of claim 20 further comprising generating a signal for use by the predistortion receiver, the signal being combined with the low power transmission signal and directed to the remote location.

22. The method of claim 21 further comprising using the signal to frequency convert the sample of the high power transmission signal to form a frequency converted signal that is used by the predistortion circuit for the purposes of predistorting the transmission signal.

23. The method of claim 22 wherein the signal is separated from the low power transmission signal at the remote location and used to provide an LO signal to frequency conversion circuitry to form the frequency converted signal.

24. The method of claim 20 further comprising generating at least one LO frequency at the base location and combining the LO frequency with the low power transmission signal and forwarding the combined signal to the remote location.

25. The method of claim 24 further comprising processing the high power transmission signal by combining the sample of the high power transmission signal with an LO frequency to form an IF signal that is used by the predistortion circuit.

26. The method of claim 24 further comprising generating the LO frequency at the base location, combining the LO frequency with the low power transmission signal for forwarding the combined signal to the remote location and filtering the combined signal at the remote location to separate the LO frequency and the low power transmission signal.

27. The method of claim 24 further comprising positioning at least one receive antenna at the remote location to capture a receive signal, and combining the LO frequency with the receive signal at the base location to form an IF signal.

28. The method of claim 27 further comprising positioning a plurality of receive antennas and generating a plurality of LO frequencies for combining with a plurality of receive signals to form a plurality of IF signals.

29. The method of claim 28 wherein the plurality of IF signals have different IF frequencies and further including combining the different IF frequencies for transmission to the base location.

30. The method of claim 28 wherein the plurality of IF signals have the same IF frequency and further including using a plurality of receive cables to transmit the IF signals to the base location.

31. The method of claim 27 wherein the IF signal has a frequency sufficiently separated from the frequency of the high power transmission signal in order to reduce interference.

* * * * *